United States Patent
Kishida

(10) Patent No.: US 10,636,714 B2
(45) Date of Patent: Apr. 28, 2020

(54) SEMICONDUCTOR DEVICE, MANUFACTURING METHOD OF SEMICONDUCTOR DEVICE, AND ELECTRONIC APPARATUS

(71) Applicant: SONY SEMICONDUCTOR SOLUTIONS CORPORATION, Kanagawa (JP)

(72) Inventor: Eiichirou Kishida, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/771,547

(22) PCT Filed: Sep. 28, 2016

(86) PCT No.: PCT/JP2016/078620
§ 371 (c)(1),
(2) Date: Apr. 27, 2018

(87) PCT Pub. No.: WO2017/077792
PCT Pub. Date: May 11, 2017

(65) Prior Publication Data
US 2018/0350707 A1    Dec. 6, 2018

(30) Foreign Application Priority Data

Nov. 5, 2015  (JP) .................. 2015-217638

(51) Int. Cl.
*H01L 23/31*   (2006.01)
*H01L 31/0203*   (2014.01)
(Continued)

(52) U.S. Cl.
CPC ........ *H01L 23/3114* (2013.01); *H01L 21/561* (2013.01); *H01L 21/6836* (2013.01);
(Continued)

(58) Field of Classification Search
CPC ....... H01L 21/78; H01L 21/561; H01L 23/12; H01L 23/28; H01L 23/3114; H01L 27/14;
(Continued)

(56) References Cited

U.S. PATENT DOCUMENTS

| | | | | |
|---|---|---|---|---|
| 7,944,015 B2* | 5/2011 | Kitagawa | ............ | H01L 21/6836 250/239 |
| 2009/0256260 A1* | 10/2009 | Nakamura | ........ | H01L 27/14618 257/758 |

(Continued)

FOREIGN PATENT DOCUMENTS

| | | |
|---|---|---|
| JP | 2009-016406 | 1/2009 |
| JP | 2010-040672 | 2/2010 |

(Continued)

OTHER PUBLICATIONS

International Search Report prepared by the Japan Patent Office dated Nov. 29, 2016, for International Application No. PCT/JP2016/078620.

*Primary Examiner* — Peniel M Gumedzoe
(74) *Attorney, Agent, or Firm* — Sheridan Ross P.C.

(57) ABSTRACT

To prevent deterioration of light incident/emission environment in a semiconductor device in which a transmissive material is laminated on an optical element forming surface via an adhesive. The semiconductor device includes a semiconductor element manufactured by chip size packaging, a transmissive material which is bonded with an adhesive to cover an optical element forming surface of the semiconductor element, and a side surface protective resin which covers an entire side surface where a layer structure of the semiconductor element and the transmissive material is exposed.

7 Claims, 7 Drawing Sheets

(51) Int. Cl.
*H01L 33/52* (2010.01)
*H01L 21/56* (2006.01)
*H01L 31/18* (2006.01)
*H01L 21/78* (2006.01)
*H01L 27/14* (2006.01)
*H01L 33/48* (2010.01)
*H01L 21/683* (2006.01)
*H01L 33/44* (2010.01)
*H01L 27/146* (2006.01)

(52) U.S. Cl.
CPC .............. *H01L 21/78* (2013.01); *H01L 27/14* (2013.01); *H01L 27/14687* (2013.01); *H01L 31/0203* (2013.01); *H01L 31/18* (2013.01); *H01L 33/44* (2013.01); *H01L 33/486* (2013.01); *H01L 33/52* (2013.01); *H01L 2221/68327* (2013.01); *H01L 2933/005* (2013.01); *H01L 2933/0033* (2013.01)

(58) Field of Classification Search
CPC ..... H01L 31/02; H01L 31/0203; H01L 31/18; H01L 33/48; H01L 33/52
See application file for complete search history.

(56) References Cited

U.S. PATENT DOCUMENTS

2010/0025710 A1   2/2010  Yamada
2010/0032781 A1*  2/2010  Ryu .................. H01L 27/14618
                                                       257/432
2010/0053318 A1   3/2010  Sasaki
2014/0203416 A1*  7/2014  Huang ............... H01L 23/3114
                                                       257/659

FOREIGN PATENT DOCUMENTS

JP    2010-056292    3/2010
JP    2010-238729    10/2010

* cited by examiner

SEMICONDUCTOR DEVICE, MANUFACTURING METHOD OF SEMICONDUCTOR DEVICE, AND ELECTRONIC APPARATUS

CROSS REFERENCE TO RELATED APPLICATIONS

This application is a national stage application under 35 U.S.C. 371 and claims the benefit of PCT Application No. PCT/JP2016/078620 having an international filing date of 28 Sep. 2016, which designated the United States, which PCT application claimed the benefit of Japanese Priority Patent Application 2015-217638 filed on 5 Nov. 2015, the disclosures of each of which are incorporated herein by reference.

TECHNICAL FIELD

The present technology relates to a semiconductor device, a method of manufacturing a semiconductor device, and an electronic apparatus.

BACKGROUND ART

Conventionally, chip size packages (CSPs) have been known that is formed by singulating a semiconductor substrate or a wafer on which wire has been rearranged and a protection film or a terminal has been formed. In particular, a wafer manufactured by a similar process is referred to as a wafer level chip size package (WCSP). Since a semiconductor device manufactured by the CPS can be realized in a size substantially equal to the semiconductor element, there are advantages such as reduction in size, width, and weight.

In a solid-state imaging device manufactured by the CSP, after a flat transparent plate is bonded with an adhesive to cover a side surface where light receiving elements of the solid-state imaging element are formed, a cutting tool cuts and singulates the bonded structure. The adhesive used to bond the transparent plate is transparent. The transparent plate may be bonded to the entire surface of the solid-state imaging element or may be bonded to surround the outer side of the light receiving element.

Here, in Patent Document 1, a disadvantage is pointed out such that when moisture entering through an interface of the adhesive reaches a space between the light receiving element and the transparent plate, the moisture adversely affects an image of the solid-state imaging device.

Patent Document 1 discloses a semiconductor chip in which a support including a transmissive material such as glass is attached to a surface of a semiconductor substrate, on which a sensor is provided, via an adhesive sheet, while an insulating film and a solder resist are sequentially laminated on a back surface of the semiconductor device. A laminated structure of the insulating film and the solder resist on the back surface of the semiconductor chip is extended to the middle of a transmissive material on a side surface of the semiconductor chip so as to go around from the back surface to the side surface of the semiconductor chip to prevent moisture from entering an air gap formed on the sensor.

CITATION LIST

Patent Document

Patent Document 1: Japanese Patent Application Laid-Open No. 2010-238729

SUMMARY OF THE INVENTION

Problems to be Solved by the Invention

The technology of Patent Document 1 described above has a configuration in which a layer of adhesive sheets appearing on the side surface of the semiconductor chip is covered with a two-layer structure including the insulating film and the solder resist to prevent water and moisture from entering the side surface of the semiconductor chip in a substantially perpendicular direction. However, the two-layer structure of the insulating film and the solder resist covering the side surface of the semiconductor chip described in Patent Document 1 is provided to the middle of the transmissive material. Therefore, there is a possibility that water and moisture reach the adhesive sheet through the interface of the insulating film.

Furthermore, regarding the semiconductor chip in Patent Document 1, the semiconductor substrate is placed and bonded to the transmissive material (support) via the adhesive sheet, the semiconductor substrate and the adhesive sheet are cut along a grid line, the insulating film is formed along a bottom surface of the semiconductor substrate and an inner wall surface of a cut groove, unnecessary insulating film is removed by etching, and a process of rewiring or the like is performed. After that, the solder resist covering the entire back surface of the semiconductor substrate and the inner wall surface of the cut groove is formed, unnecessary solder resist is removed, and finally, the whole structure including the transmissive material is cut and singulated along the center portion of the cut groove. The semiconductor chip in Patent Document 1 is manufactured in this way. Therefore, a precise and complicated manufacturing process has been required for protecting the side surfaces.

Furthermore, not only a semiconductor device as a solid-state imaging device including a light receiving element but also a semiconductor device including a light emitting element similarly has the above problem. In addition, in a case where the semiconductor device manufactured by the CSP includes an optical element such as the light receiving element and the light emitting element, there is a problem of flare and ghost caused by light entered from the side surfaces where the laminated structure is exposed by cutting.

The present technology has been made in view of the above problems. A purpose of the present technology is to prevent deterioration of light incident/emission environment in a semiconductor device in which a transmissive material is laminated on an optical element forming surface via an adhesive.

Solutions to Problems

One aspect of the present technology is a semiconductor device including a semiconductor element manufactured by chip size packaging, a transmissive material which is bonded with an adhesive to cover an optical element forming surface of the semiconductor element, and a side surface protective resin which covers an entire side surface where a layer structure of the semiconductor element and the transmissive material is exposed.

One aspect of another aspect according to the present technology is a method of manufacturing a semiconductor device including a workpiece forming process of bonding a semiconductor substrate on which a plurality of semiconductor elements is formed by chip size packaging to a transmissive material to cover an optical element forming surface of the semiconductor element with an adhesive to form a workpiece, a first cutting process of singulating the workpiece fixed to a dicing sheet into a plurality of main structures of a semiconductor element, a reconnecting process of filling a resin into first grooves which are gaps between the plurality of main structures fixed to the dicing sheet and curing the resin to reconnect the plurality of main structures, and a second cutting process of forming a second groove narrower than the first groove along a substantially center of the first groove to singulate as the plurality of semiconductor devices while remaining the resin on the side surfaces of the plurality of main structures.

One aspect of still another aspect according to the present technology is a method of manufacturing a semiconductor device, including a workpiece forming process of bonding a semiconductor substrate on which a plurality of semiconductor elements is formed by chip size packaging to a transmissive material to cover an optical element forming surface of the semiconductor element with an adhesive to form a workpiece, a V-shaped groove forming process of forming a V-shaped groove along a boundary between the semiconductor elements from a side of the transmissive material, a first cutting process of cutting the workpiece fixed to a dicing sheet into a plurality of main structures of the semiconductor element along a point of the V-shaped groove and singulating the workpiece, a reconnecting process of filling a resin into first grooves and the V-shaped grooves which are gaps between the plurality of main structures fixed to the dicing sheet and curing the resin to reconnect the plurality of main structures, and a second cutting process of forming a second groove narrower than the first groove in the resin along a substantially center of the first groove to singulate as the plurality of semiconductor devices while remaining the resin on the side surfaces of the plurality of main structures.

Still yet another aspect of the present technology is an electronic apparatus including a semiconductor device including a semiconductor element manufactured by chip size packaging, a transmissive material which is bonded with an adhesive to cover an optical element forming surface of the semiconductor element, and a side surface protective resin which covers an entire side surface where a layer structure of the semiconductor element and the transmissive material is exposed.

Note that the semiconductor device and the electronic apparatus described above include various aspects such as an aspect implemented in a state where the device is incorporated in another device and an aspect implemented by other methods. In addition, the above method of manufacturing the semiconductor device includes various aspects such as an aspect implemented as a part of another manufacturing method and an aspect realized as a manufacturing apparatus including units corresponding to the processes in the manufacturing method or a control program to control the manufacturing apparatus.

Effects of the Invention

According to the present technology, it is possible to prevent deterioration of light incident/emission environment in a semiconductor device in which a transmissive material is laminated on an optical element forming surface via an adhesive.

MODE FOR CARRYING OUT THE INVENTION

The present technology is described below in the following order.
(A) First embodiment:
(B) Second embodiment:
(C) Third embodiment:

(A) First Embodiment

A semiconductor device 100 according to the present embodiment includes a semiconductor element 10 manufactured by chip size packaging (CSP), a transmissive material 20 bonded with an adhesive so as to cover an optical element forming surface of the semiconductor element 10, and a side surface protective resin 50 which covers an entire side surface where a layer structure including the semiconductor element 10 and the transmissive material 20 is exposed. Note that the chip size packaging (CSP) includes a wafer level chip size package (WCSP).

Figure 1:
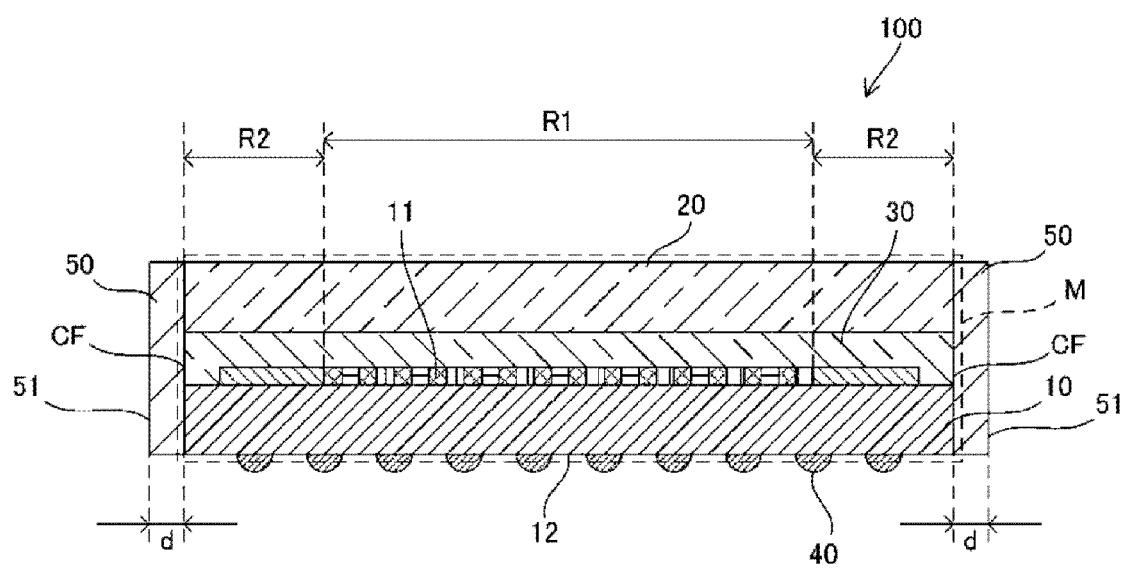
FIG. 1 is a diagram of a schematic cross-sectional configuration of a semiconductor device according to a first embodiment.

FIG. 1 is a diagram of a schematic cross-sectional configuration of the semiconductor device 100 according to the present embodiment.

The semiconductor element 10 is a thin plate-like element having a substantially rectangular shape in a plan view. A plurality of optical elements is formed on an optical element forming surface 11 which is one of surfaces of the semiconductor element 10, and a connection terminal to a mounting substrate is formed on a terminal forming surface 12 which is the other surface of the semiconductor element 10. As an optical element to be formed on the optical element forming surface 11, a light receiving element such as a photodiode, and a phototransistor, an image sensor (solid-state imaging element) represented by a Charge-Coupled Device (CCD) and a Complementary Metal Oxide Semiconductor Image Sensor (CMOS), and in addition, a light emitting element such as a light emitting diode are used, for example. In the following description, the semiconductor element 10 as a solid-state imaging element having light receiving elements formed on the optical element forming surface 11 will be described as an example.

The optical element forming surface 11 of the semiconductor element 10 has a light receiving region R1 as a region where light is required and a non-light-receiving region R2 as a region where light is not required. In the light receiving region R1, a plurality of light receiving elements for receiving external light which enters through the transmissive material 20 is disposed, and in the non-light-receiving region R2, the light receiving element for receiving the external light is not disposed. The light receiving region R1 is formed in a range apart from edges of the optical element forming surface 11, and the non-light-receiving region R2 is formed along the edge of the optical element forming surface 11 around the light receiving region R1.

The transmissive material 20 includes transparent optical glass and the like and is bonded to the optical element forming surface of the semiconductor element 10 with an adhesive. With this structure, an adhesive layer 30 where the adhesive is solidified is formed between the semiconductor element 10 and the transmissive material 20. Furthermore, the transmissive material 20 may have an antireflection function or an infrared ray cutting function by laminating an antireflection film or an infrared ray cutting film on the optical glass, for example.

The adhesive layer 30 may be formed over the entire surface between the optical element forming surface 11 and the transmissive material 20 and may be formed in a range of the non-light-receiving region R2 between the optical element forming surface 11 and the transmissive material 20.

In FIG. 1, the former case is exemplified. In a case where the adhesive layer 30 is formed over the entire optical element forming surface 11, the adhesive layer 30 includes a transparent adhesive.

The adhesive layer 30 includes a material having heat resistance property, moisture resistance property, light resistance property, and chemical resistance property according to specifications of the semiconductor device 100 and having a refractive index of 1.48 to 1.6 and a transmittance equal to or higher than 90%.

In the semiconductor device 100, a portion where the semiconductor element 10 and the transmissive material 20 are laminated with the adhesive layer 30 interposed therebetween is a main structure M. On a side surface of the main structure M, a cutting plane CF is formed by cutting the main structure M along a lamination direction. The side surface protective resin 50, including a resin, is provided so as to cover the entire cutting plane CF (range from top surface of transmissive material 20 to bottom surface of semiconductor element 10) from the side. The side surface protective resin 50 is formed to have a thickness d from a surface facing to the semiconductor element 10 and the transmissive material 20 (surface facing to cutting plane CF) to an opposite surface (side surface of semiconductor device 100) which is constant across the entire semiconductor element 10 and the entire transmissive material 20 in the lamination direction.

It is preferable that the resin forming the side surface protective resin 50 be an absorber for absorbing visible light or ultraviolet light. For example, the side surface protective resin 50 includes a black opaque resin or the like. Furthermore, a spectral transmittance of the side surface protective resin 50 is set to equal to or less than 5%, and more preferably equal to or less than 1% at a wavelength of 300 to 1200 nm. Examples of such resins include epoxy resins containing carbon, acrylic resins, silicone resins and the like.

Furthermore, the side surface protective resin 50 includes a resin having lower moisture permeability and lower water permeability than the adhesive layer 30 including the adhesive. As a combination of the resins of the side surface protective resin 50 and the adhesive layer 30, for example, the resin of the adhesive layer 30 includes, for example, an epoxy resin, an acrylic resin, a silicone resin and the like, and the resin of the side surface protective resin 50 includes, for example, an epoxy resin containing carbon, an acrylic resin, a silicone resin and the like.

A side surface 51, which does not face to the main structure M, of the side surface protective resin 50 is exposed to the outside as a side surface of the semiconductor device 100. The side surface 51 is formed by cutting the side surface protective resin 50 with a cutting tool. Therefore, cutting traces corresponding to the type of the cutting tool remain on the entire side surface 51. Examples of the cutting tool include a dicing blade, a laser cutter, an ultrasonic cutter, a wire saw, a water jet, and the like.

In addition, a plurality of metal pads (not shown) to be the connection terminals to the mounting substrate is formed on the terminal forming surface 12 of the semiconductor element 10, and solder bumps 40 are respectively formed on the metal pads. Note that there are cases where the solder bumps 40 are not provided. Furthermore, in the semiconductor element 10, a through electrode and wiring (not shown) which pass through the portion between the front surface and the rear surface electrically connect between an electrode pad (not shown) formed around the optical element on the front surface and the metal pad on the terminal forming surface 12. On the optical element forming surface 11 of the semiconductor element 10, a color filter and a microlens are sequentially laminated on the light receiving element.

Next, with reference to FIGS. 2 and 3, a method of manufacturing the semiconductor device 100 will be described. Note that a method of forming the side surface protective resin 50 will be described below. As a process of manufacturing the plurality of semiconductor devices 100, which is not singulated yet, on a wafer by CSP, known various methods and various methods to be developed in the future can be appropriately employed.

In FIG. 2(a), a workpiece W is illustrated which has the plurality of undivided main structures M which is continuously formed by bonding sheet-shaped glass as the transmissive material 20 on the wafer on which the plurality of semiconductor elements 10 is formed and which is not singulated yet with an adhesive.

First, in the present embodiment, as illustrated in FIG. 2(b), the workpiece W is arranged as facing the terminal forming surface 12 of the semiconductor element 10 upward, and a protective member PS is bonded to the terminal forming surface 12 of the semiconductor element 10. The protective member PS closely adheres to a bottom surface of the workpiece W to protect a circuit surface from foreign substances and to protect the circuit surface from breakage at the time of back grinding and dicing. For example, a cutting tape for a semiconductor wafer manufacturing process can be used.

Next, as illustrated in FIG. 2(c), the workpiece W is placed on a dicing sheet DS, and the upper surface of the transmissive material 20 is bonded to the dicing sheet DS. When the workpiece W is cut or after the workpiece W has been cut as will be described later, the dicing sheet DS fixes the singulated main structures M and the semiconductor device 100 so as not to change a relative positional relationship between the main structures M and the semiconductor device 100.

Next, as illustrated in FIG. 2(d), with a first cutting tool CD1 such as a dicing blade, the workpiece N is cut along a dicing line with a first cutting width w1 to singulate the workpiece W into the plurality of main structures M. At this time, the first cutting tool CD1 cuts the workpiece W to completely separate it from each other and not to separate the dicing sheet DS. As a result, the plurality of main structures M is singulated in a state of being fixed on the dicing sheet DS while maintaining the relative positional relationship before being cut. That is, between the plurality of main structures M on the dicing sheet DS, first grooves T1 with a width w1 are formed. The first groove T1 has the dicing sheet DS as a bottom and the cutting planes CF which are the side walls of the main structure M as side walls.

Next, as illustrated in FIG. 3(e), a liquid resin LP is injected into the first groove T1 by using masks MK. As the mask MK used here, a partial mask for partially covering the workpiece W, not a mask for totally covering the entire workpiece W, is used. For example, as illustrated in FIG. 4, vertical and horizontal sizes h and w of an opening of each partial mask are respectively equal to or less than vertical and horizontal sizes h0 and w0 of four main structures M formed in a state where the main structures M are arranged adjacent to each other across the first grooves T1.

Figure 4:
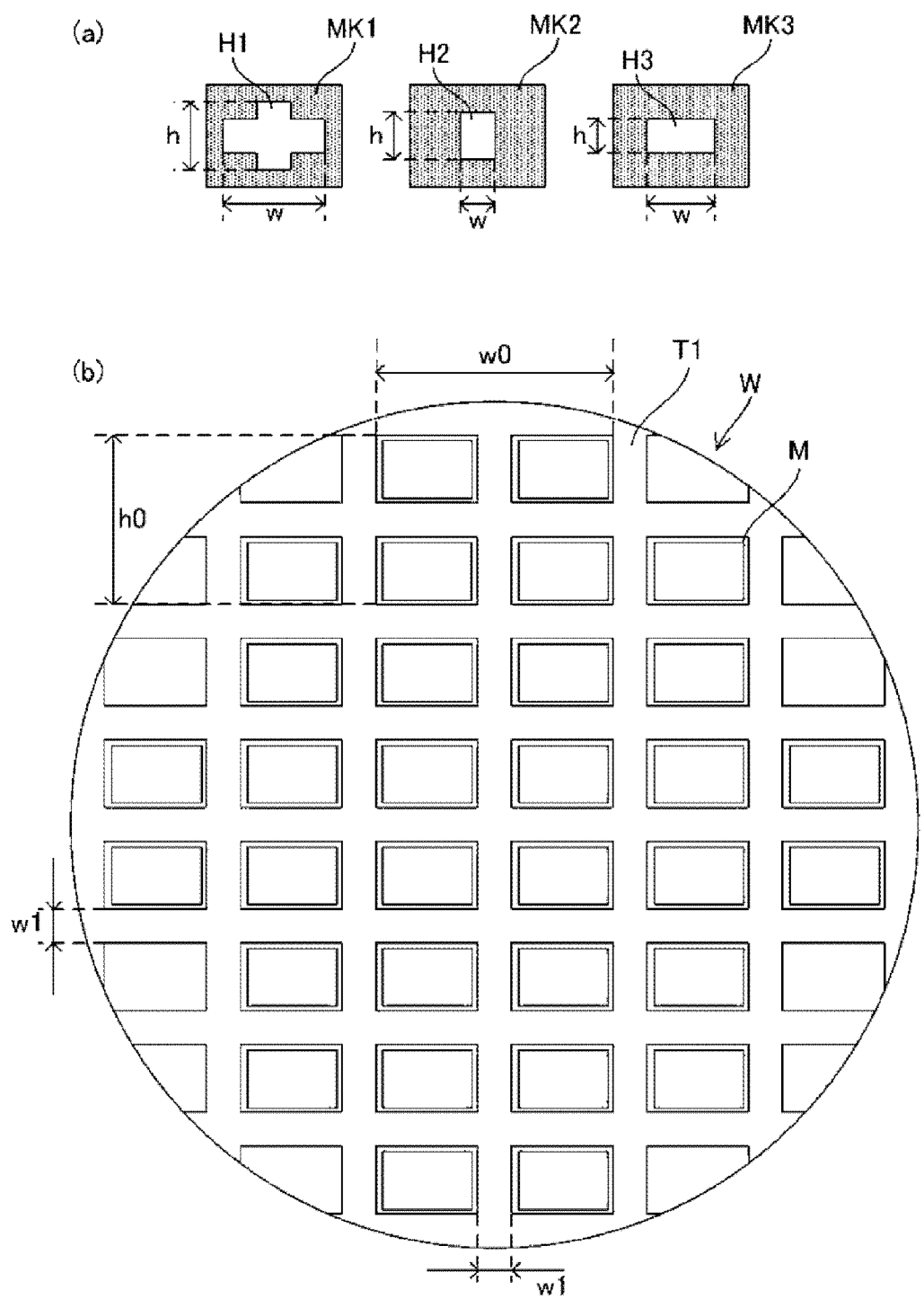
FIG. 4 is a diagram to describe filling of a liquid resin into a first groove using a partial mask.
Figure 5:
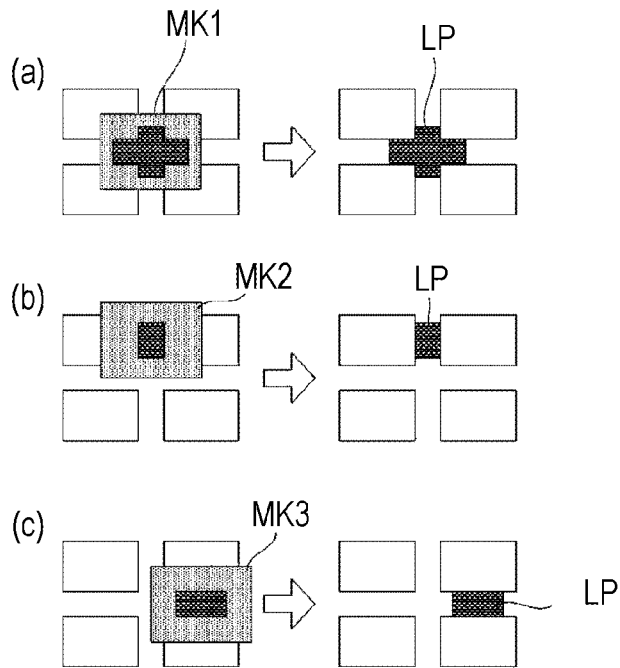
FIG. 5 is a diagram to describe the filling of the liquid resin into the first groove using the partial mask.

FIGS. 4 and 5 are diagrams to describe filling of the liquid resin LP into the first groove T1 by using the partial mask. Note that the liquid resin LP is a resin of which a solidified solid resin SP is a black opaque resin, for example. A spectral transmittance of the liquid resin LP is equal to or less than 5%, and more preferably equal to or less than 1% at the wavelength of 300 to 1200 nm.

FIGS. 4 and 5 illustrate a case where a plurality of types of partial masks MK1 to MK3 are used. That is, as illustrated in FIG. 4(a), the first partial mask MK1 has a cross-shaped mask opening H1, the second partial mask MK2 has a vertically linear mask opening H2 extending in the vertical direction, and the third partial mask MK3 has a laterally linear mask opening H3 extending in the horizontal direction. The workpiece W illustrated in FIG. 4(b) is cut by a process illustrated in FIG. 2(d) to form the first grooves T1, and the plurality of main structures M is formed in a matrix as sandwiching the first grooves T1 formed in a lattice shape.

As illustrated in FIG. 5(a), the first partial mask MK1 is used to fill intersections of the first grooves T1 with the liquid resin LP. As illustrated in FIG. 5(b), the second partial mask MK2 is used to fill the first groove T1 extending along the vertical direction between the intersections of the first grooves T1 with the liquid resin LP. As illustrated in FIG. 5(c), the third partial mask MK3 is used to fill the first groove T1 extending along the horizontal direction between the intersections of the first grooves T1 with the liquid resin LP.

The partial masks MK1 to MK3 are appropriately selected and used, and the first grooves T1 are filled with the liquid resin LP. Thus, the entire first grooves T1 formed in a lattice shape can be filled with the liquid resin LP. As the liquid resin LP filled into the first groove T1, a resin which can be cured by post-processing such as an ultraviolet ray (UV) curable resin and a thermosetting resin is used. Furthermore, the shape of the partial mask is not limited to the combination of the shapes of the partial masks MK1 to MK3. As long as a combination of opening patterns of the plurality of partial masks can express the shape of all the first grooves T1 as common divisors, a combination of various shapes can be employed.

Next, as illustrated in FIG. 3(f), the liquid resin LP filled into the first groove T1 cures by UV irradiation, heating and the like. As a result, the workpiece W divided into the plurality of main structures M is connected with the solid resin SP and integrated as a reconnection workpiece W'. Furthermore, in a case where a thermosetting resin is used to fill the first grooves T1, a heat-resistant dicing sheet DS and a heat-resistant protective member PS are used. In a case where a UV curable resin is used to fill the first grooves T1, a UV-resistant dicing sheet DS and a UV-resistant protective member PS are used. It is desirable that the solid resin SP be an absorber for absorbing visible light or ultraviolet light. For example, the solid resin SP includes a black opaque resin or the like. Furthermore, a spectral transmittance of the solid resin SP is set to equal to or less than 5%, and more preferably equal to or less than 1% at a wavelength of 300 to 1200 nm. Examples of such resins include epoxy resins containing carbon, acrylic resins, silicone resins and the like.

Next, as illustrated in FIG. 3(g), with a second cutting tool CD2 such as a dicing blade, the reconnection workpiece W' is cut along a dicing line with a second cutting width w2 to singulate the workpiece W' into the plurality of semiconductor devices 100. The second cutting width w2 of the second cutting tool CD2 is narrower than the first cutting width w1 of the first cutting tool CD1, and a width w2 of a second groove T2 formed by the second cutting tool CD2 is narrower than the width w1 of the first groove T1. The second cutting tool CD2 cuts the solid resin SP filled and cured in the first groove T1 along the direction in which the first groove T1 extends so that the solid resin SP remains on the side surface of each main structure M to form the second groove T2. Note that, to form the side surface protective resin 50 having a uniform thickness across the entire side surface of the main structure M, the substantially center of the width direction of the groove is cut along the extending direction of the first groove T1. More specifically, when the semiconductor device 100 manufactured by the WCSP is singulated, it is desirable that the width w1 of the first groove T1 be more than twice of the width w2 of the second groove T2. More specifically, it is desirable that a width of the second groove T2 be equal to or less than 50 µm.

At the time of the cutting by using the second cutting tool CD2, the second cutting tool CD2 cuts the reconnection workpiece W' to completely separate it from each other and not to separate the dicing sheet DS. As a result, the plurality of semiconductor devices 100 is singulated on the dicing sheet DS while maintaining the relative positional relationship before being cut. That is, between the plurality of semiconductor devices 100 on the dicing sheet DS, the second groove T2 with the width w2 is formed. The second groove T2 has the dicing sheet DS as a bottom and the side surfaces 51 of the semiconductor device 100 as side walls.

In this way, the solid resin SP in the first groove T1 is cut with the second cutting width w2 narrower than the first cutting width w1, and the semiconductor device 100 is singulated as remaining the solid resin SP on the side surfaces of the main structure M. Therefore, the semiconductor device 100 in which the cutting planes CF of the main structure M are covered with the side surface protective resin 50 having a substantially uniform thickness is manufactured. Furthermore, the side surface 51 of the side surface protective resin 50 of the semiconductor device 100 has cutting traces made by being cut by the second cutting tool CD2.

Finally, the singulated semiconductor devices 100 are separated from the dicing sheet DS. Accordingly, the plurality of semiconductor devices 100 illustrated in FIG. 1 is manufactured. The semiconductor device 100 manufactured by the manufacturing method has a structure in which the entire side surface, where the layer structure formed by bonding the semiconductor element 10 to the transmissive material 20 with the adhesive layer 30 is exposed, is covered with the side surface protective resin 50, and the cutting traces made by the second cutting tool CD2 are formed across the entire side surface 51 of the side surface protective resin 50. Furthermore, the side surface protective resin 50 includes an opaque resin of black and the like having lower moisture permeability and lower water permeability than the adhesive layer 30 including the adhesive.

(B) Second Embodiment

Figure 6:
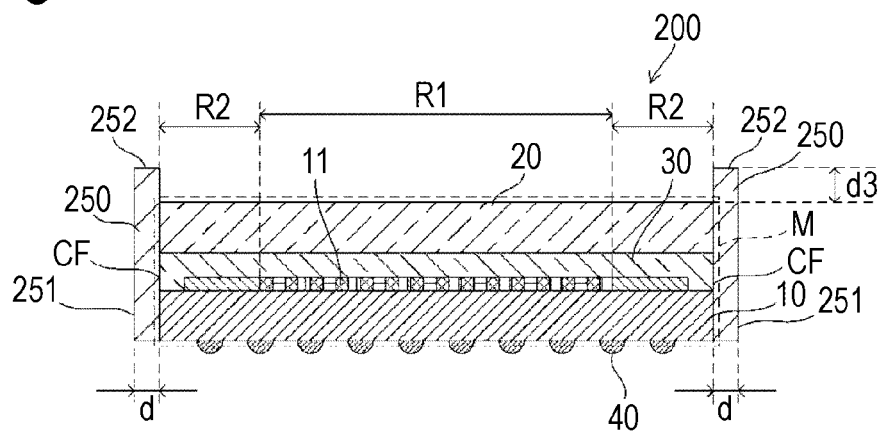
FIG. 6 is a diagram of a schematic cross-sectional configuration of a semiconductor device according to a second embodiment.

FIG. 6 is a diagram of a schematic cross-sectional configuration of a semiconductor device 200 according to the present embodiment. Furthermore, since the semiconductor device 200 has a configuration similar to that of the semiconductor device 100, except for the shape of the side surface protective resin, components other than the side surface protective resin are denoted with the same reference numerals as the semiconductor device 100, and the detailed description is omitted.

In the semiconductor device 200, side surface protective resins 250 including a resin are provided to cover entire cutting planes CF exposed on side surfaces of a main structure M (range from upper surface of transmissive material 20 to bottom surface of semiconductor element 10) from the side. In addition, the side surface protective resin 250 has a projection 252 extending upward from the transmissive material 20 by a projection amount d3.

An upper end surface of the projection 252 is formed substantially flat, and other components can be placed on the upper end surface as a reference surface. For example, in a case where the semiconductor device 200 is a solid-state imaging device, as a member to be placed on the projection 252, a lens housing for collecting external light to a light receiving region R1, a lens module integrating a lens and a motor as a lens driving unit and the like are exemplified. The projection amount d3 of the projection 252 is appropriately selected according to an optical length of the member placed on the projection 252 and other necessary distances.

In this way, the projection 252 is provided on the side surface protective resin 250 so that other components can be placed on the projection 252. This can reduce the entire size of an electronic apparatus to which the semiconductor device 200 is mounted.

Figure 2:
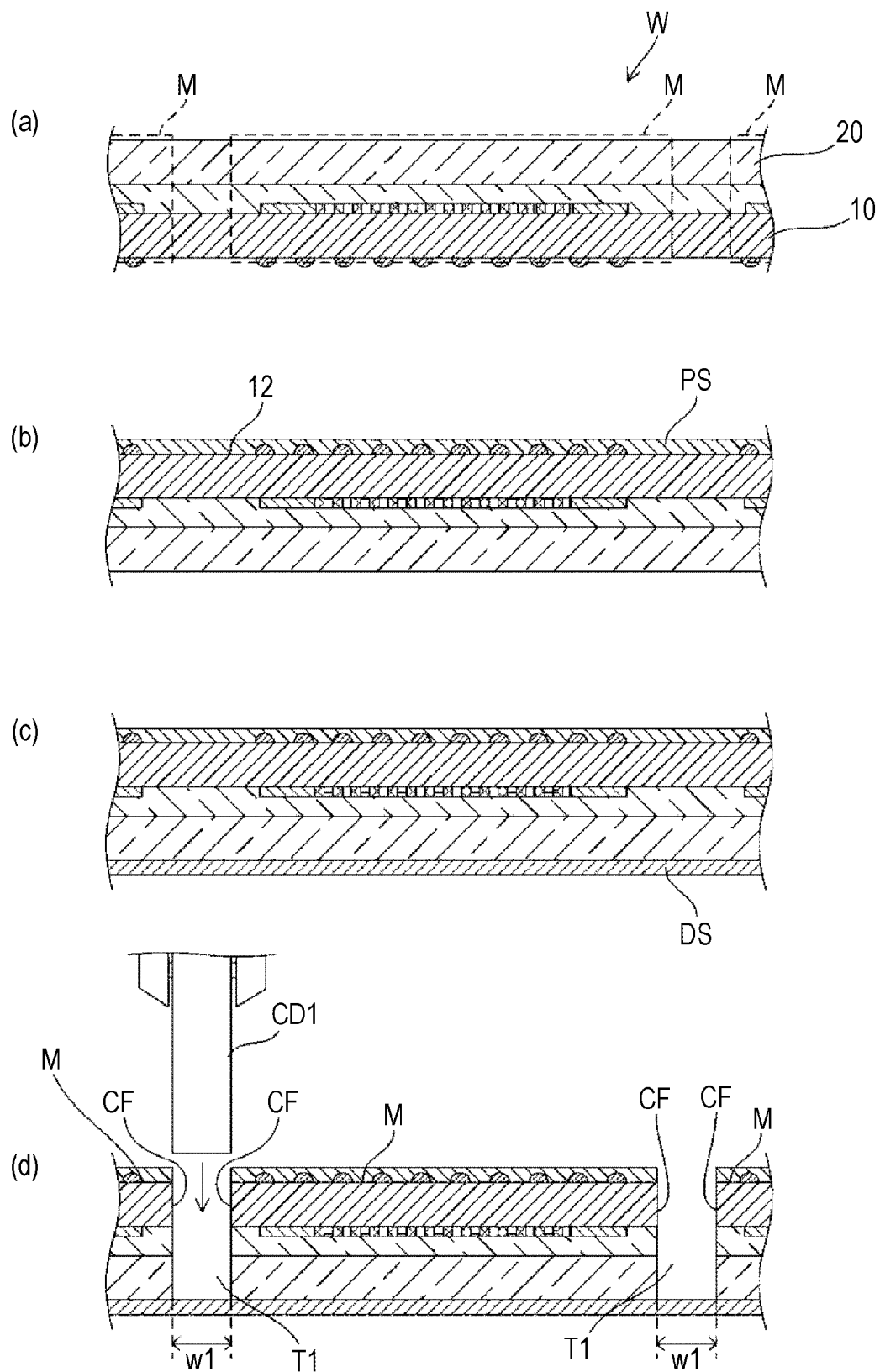
FIG. 2 is a diagram to describe a method of manufacturing a semiconductor device according to the first embodiment.
Figure 3:
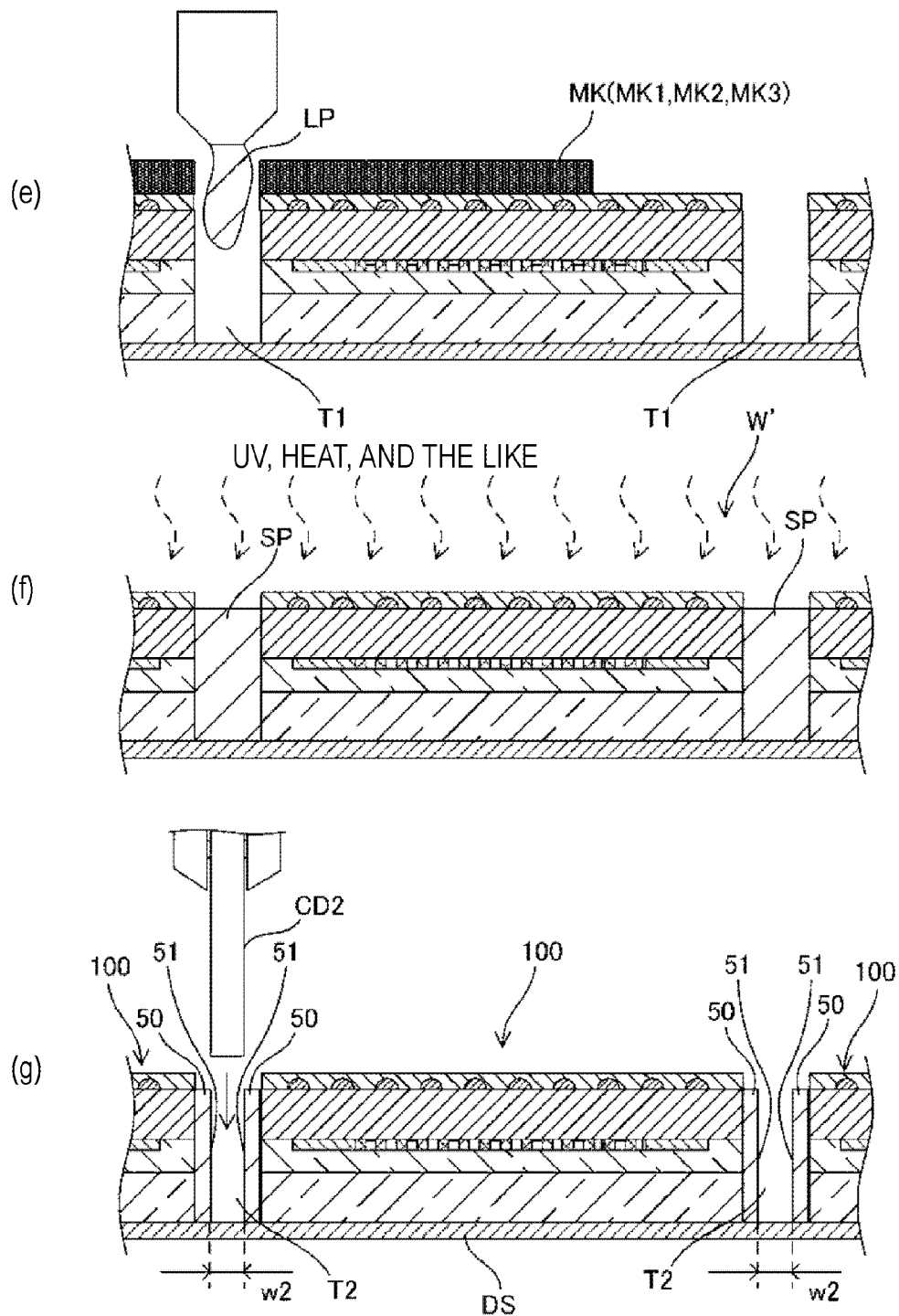
FIG. 3 is a diagram to describe the method of manufacturing a semiconductor device according to the first embodiment.

A method of manufacturing the semiconductor device 200 is basically similar to the method of manufacturing the semiconductor device 100 illustrated in FIGS. 2 and 3. However, a thickness of the dicing sheet DS to be used, a depth of a cutting portion made by the first cutting tool CD1 illustrated in FIG. 2(d), and a shape of a filling resin according to the depth of the cutting portion are different from those of the method of manufacturing the semiconductor device 100.

Figure 7:
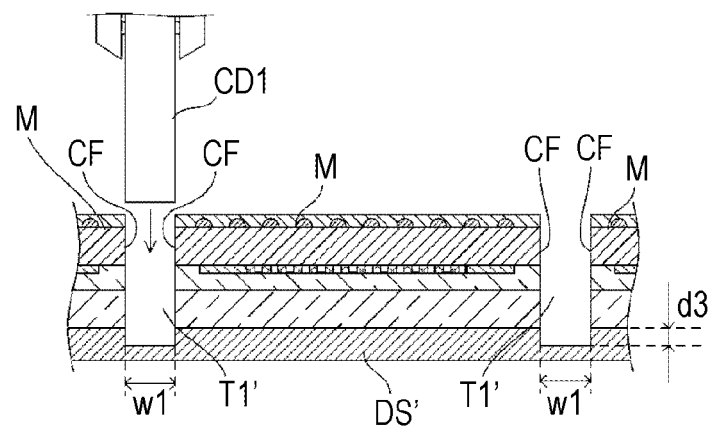
FIG. 7 is a diagram to describe a method of manufacturing a semiconductor device according to the second embodiment.

That is, as illustrated in FIG. 7, in consideration of the projection amount d3 of the projection 252, a dicing sheet DS' thicker than the projection amount d3 is used. Then, when a groove is formed by using the first cutting tool CD1, a first groove T1' having a width w1 same as the width of the first groove T1 is formed. The first groove T1' is deeper than the first groove T1 by a depth d3.

As a result, when the first groove T1 is filled with a liquid resin LP, a portion formed by cutting the dicing sheet DS is filled with the liquid resin LP, and the portion is irradiated with heat or ultraviolet. In this way, a solid resin SP formed by curing the liquid resin LP in the first groove T1' is formed. By separating the solid resin SP formed in this way with a second cutting tool CD2, the side surface protective resin 250 integrally formed with the projection 252 can be formed to cover the cutting plane CF of the side surface of the main structure M.

(C) Third Embodiment

Figure 8:
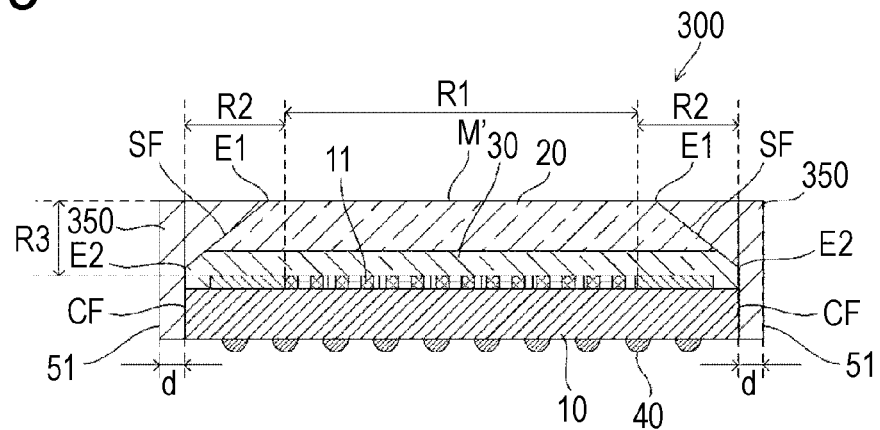
FIG. 8 is a diagram of a schematic cross-sectional configuration of a semiconductor device according to a third embodiment.

FIG. 8 is a diagram of a schematic cross-sectional configuration of a semiconductor device 300 according to the present embodiment. The semiconductor device 300 is different from the semiconductor device 100 in a point that a side surface protective resin is formed to be overhung in an eave shape toward a main structure M near a surface of a transmissive material 20 and the side surface protective resins respectively cover edges of the transmissive material 20. Furthermore, except for this structure, the semiconductor device 300 has a configuration substantially similar to that of the semiconductor device 100. Components common to or corresponding to the components in the semiconductor device 100 are denoted with the same reference numerals, and the detailed description is omitted.

A main structure M' of the semiconductor device 300 has a shape in which corners of the edges of the top surface of the main structure M of the semiconductor device 100 are obliquely cut to form slopes SF. A corner E1 between the slope SF and the surface of the transmissive material 20 is formed along the edge of the main structure M' on the surface of the transmissive material 20 within a range of a non-light-receiving region R2. A corner E2 between the slope SF and the cutting plane CF of the main structure M' is formed along an upper edge of the main structure M' on the side surface of the main structure M' within a range of a transmissive region R3 between the top surface of the transmissive material 20 and the surface of the semiconductor element 10.

By providing such a slope SF, the cutting plane CF formed by cutting the main structure M' along the lamination direction is exposed in a lower portion of the side surface of the main structure M', and the slope SF formed by obliquely cutting the corner is exposed in an upper portion. Both of the exposed cutting plane CF and slope SF are covered with the side surface protective resin 350. The side surface protective resin 350 is formed to have a thickness d from the cutting plane CF to be entirely and substantially constant, including an exposure range of the slope SF, and a cross section of the semiconductor device 300 illustrated in FIG. 8 is formed in a substantially rectangular shape.

Hereinafter, with reference to FIGS. 9 and 10, a method of manufacturing the semiconductor device 300 will be described.

Note that a method of forming the side surface protective resin 350 will be described below. As a process of manufacturing the plurality of semiconductor devices 300 which is not singulated yet on a wafer by CSP, known various methods and various methods to be developed in the future can be appropriately employed.

In FIG. 9(a), a workpiece W is illustrated which has the plurality of undivided main structures M' which is continuously formed by bonding sheet-shaped glass as the transmissive material 20 on the wafer on which the plurality of semiconductor elements 10 is formed and which is not divided yet with an adhesive.

In the manufacturing method, first, as illustrated in FIG. 9(b), the workpiece W is arranged as facing a terminal forming surface 12 of the semiconductor element 10 downward, and the workpiece W is placed on the dicing sheet DS, and then, the terminal forming surface 12 is bonded to the dicing sheet DS. When the workpiece W is cut or after the workpiece W has been cut as will be described later, the dicing sheet DS fixes the singulated main structures M' and the semiconductor device 100 so as not to change a relative positional relationship between the main structures M' and the semiconductor device 100.

Figure 9:
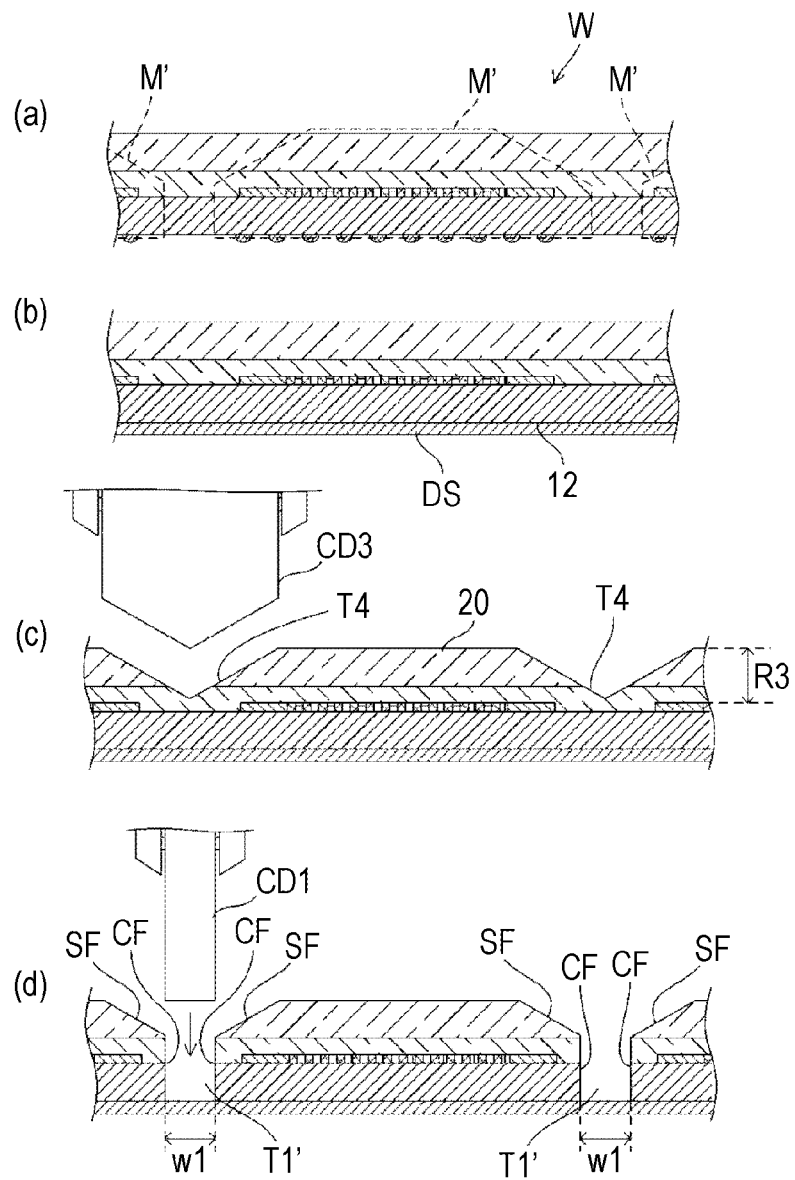
FIG. 9 is a diagram to describe a method of manufacturing a semiconductor device according to the third embodiment.
Figure 10:
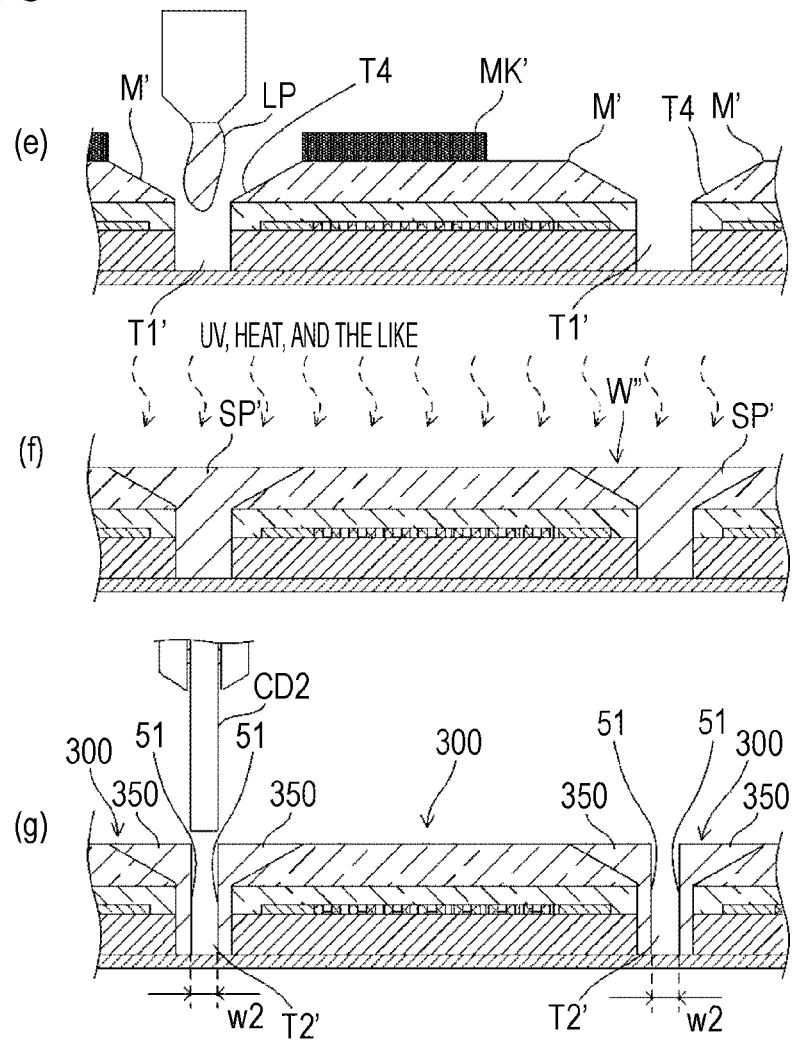
FIG. 10 is a diagram to describe the method of manufacturing a semiconductor device according to the third embodiment.

Next, as illustrated in FIG. 9(c), with a third cutting tool CD3 such as a dicing blade, the slopes SF of the unseparated main structures M' formed adjacent to each other in the workpiece W are formed. The third cutting tool CD3 illustrated in FIG. 9 includes a cutting part to have contact with a cutting target which has a cross section projected in a V shape and pointed. While moving the point along a dicing line of the workpiece W, the workpiece W is cut from the side of the transmissive material 20 so that the point of the third cutting tool CD reaches a certain depth within a range of the transmissive region R3. As a result, a fourth groove T4 having a V-shaped cross section is formed in the workpiece W along the dicing line.

Next, as illustrated in FIG. 9(d), with a first cutting tool CD1 such as a dicing blade, the workpiece W is cut along a dicing line with a first cutting width w1 to singulate the workpiece W into the plurality of main structures M'. At this time, the first cutting tool CD1 cuts the workpiece W to completely separate it from each other and not to separate the dicing sheet DS. As a result, the plurality of main structures M' is singulated on the dicing sheet DS while maintaining the relative positional relationship before being cut. That is, between the plurality of main structures M' on the dicing sheet DS, first grooves T1' with a width w1 is formed. The first groove T1' has the dicing sheet DS as a bottom and the cutting planes CF which are the side walls of the main structure M' as side walls. Furthermore, the fourth groove T4 is divided into right and left portions along the point of the V-shaped groove, and each slope of the V shape forms the slope SF described above.

Next, as illustrated in FIG. 10(e), a liquid resin LP is injected into the first groove T1' and the fourth groove T4 by using a mask MK'. As the mask MK', a partial mask is used which has basically similar shape as the mask MK according to the first embodiment and partially covers the workpiece W and does not totally covers the entire workpiece W. However, an opening width is formed wider by an extent that the opening width of the slope SF is widened.

Next, as illustrated in FIG. 10(f), the liquid resin LP filled into the first groove T1' and the fourth groove T4 cures by UV irradiation, heating, and the like. As a result, the workpiece W divided into the plurality of main structures M' is connected with a solid resin SP' and integrated as a reconnection workpiece W'''. Note that the characteristics of the resin and the dicing sheet DS are similar to those of the first embodiment.

Next, as illustrated in FIG. 10(g), with a second cutting tool CD2 such as a dicing blade, the reconnection workpiece W''' is cut along a dicing line with a second cutting width w2 to singulate the workpiece W''' into the plurality of semiconductor devices 300. The shape of the second cutting tool CD2 is similar to that of the first embodiment. The second cutting tool CD2 cuts the solid resin SP' filled and cured in the first groove T1' and the fourth groove T4 along the direction in which the first groove T1 extends so that the solid resin SP' remains on the side surface of each main structure M' to form a second groove T2'. Note that, to form the side surface protective resin 350 having a uniform thickness across the side surface of a lower portion of the main structure M', the substantially center of the width direction of the groove is cut along the extending direction of the first groove T1'. More specifically, when the semiconductor device 300 manufactured by the WCSP is singulated, it is desirable that the width w1 of the first groove T1' be equal to or more than twice of the width w2 of the second groove T2'. More specifically, it is desirable that a width of the second groove T2' be equal to or less than 50 µm.

At the time of the cutting by using the second cutting tool CD2, the second cutting tool CD2 cuts the reconnection workpiece W''' to completely separate it from each other and not to separate the dicing sheet DS. As a result, the plurality of semiconductor devices 300 is singulated on the dicing sheet DS while maintaining the relative positional relationship before being cut. That is, between the plurality of semiconductor devices 300 on the dicing sheet DS, the second groove T2' with the width w2 is formed. The second groove T2' has the dicing sheet DS as a bottom and the side surfaces 51 of the semiconductor device 300 as side walls.

In this way, while the solid resin SP in the first groove T1 is cut with the second cutting width w2 narrower than the first cutting width w1, the workpiece is singulated into the semiconductor devices 300 as remaining the solid resin SP on the side surfaces of the main structure M'. Therefore, the lower portion of the cutting plane CF of the main structure M' is covered with the side surface protective resin 350, and the upper portion of the side surface of the main structure M' is overhung toward the main structure M' near the surface of the transmissive material 20. In this way, the semiconductor device 300 in which the side surface protective resin 350 covers the edge of the transmissive material 20 is manufactured. Furthermore, a side surface 351 of the side surface protective resin 350 of the semiconductor device 300 has cutting traces made by cutting by the second cutting tool CD2.

Finally, the singulated semiconductor devices 300 are separated from the dicing sheet DS. Accordingly, the plurality of semiconductor devices 300 illustrated in FIG. 8 is manufactured. The semiconductor device 300 manufactured by the manufacturing method has a structure in which the entire side surface, where the layer structure formed by bonding the semiconductor element 10 to the transmissive material 20 with the adhesive layer 30 is exposed, is covered with the side surface protective resin 350, and the cutting traces made by the second cutting tool CD2 are formed across the entire side surface 51 of the side surface protective resin 350. Furthermore, the side surface protective resin 350 includes an opaque resin of black and the like having lower moisture permeability and lower water permeability than the adhesive layer 30 including the adhesive. In addition, since the side surface protective resin 350 is overhung in an eaves shape within a range of the non-light-receiving region R2, optical characteristics are further improved.

(D) Sixth Embodiment

Figure 11:
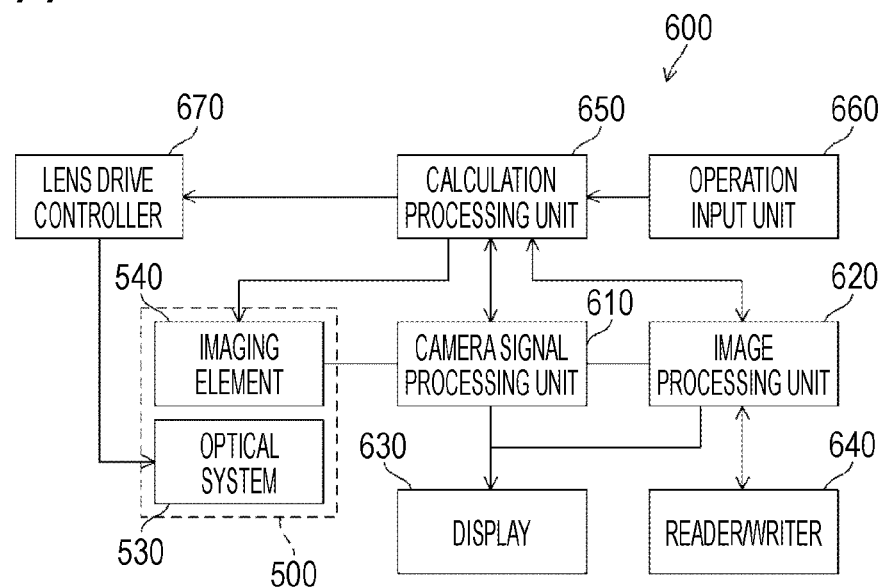
FIG. 11 is a block diagram of an exemplary schematic configuration of an imaging device.

FIG. 11 is a block diagram of a schematic configuration of an exemplary imaging device 600 as an example of an electronic apparatus on which a semiconductor device according to the embodiments is mounted. The imaging device 600 is, for example, a digital still camera, a digital video camera, and a mobile phone with a camera.

The imaging device 600 includes a module 500, a camera signal processing unit 610, an image processing unit 620, a display 630, a reader/writer 640, a calculation processing unit 650, an operation input unit 660, and a lens drive controller 670.

The module 500 is a component having an imaging function and includes an optical system 530 including a lens 511 as an imaging lens, and an imaging element 540 such as Charge Coupled Devices (CCD) and a Complementary Metal Oxide Semiconductor (CMOS). The imaging element 540 corresponds to the semiconductor device described above. The imaging element 540 converts an optical image formed by the optical system 530 into an electric signal and outputs an imaging signal (image signal) corresponding to the optical image.

The camera signal processing unit 610 performs various signal processing to the image signal output from the imaging element 540. The various signal processing includes analog/digital conversion, noise elimination, image quality correction, conversion into luminance and color difference signals, and the like.

The image processing unit 620 performs recording and reproducing processing of the image signal and performs compression encoding and expansion decoding processing to the image signal based on a predetermined image data format and conversion processing of a data specification such as a resolution, for example.

The display 630 has a function of displaying a display according to an operation input to the operation input unit 660 and various data such as a captured image.

The reader/writer 640 writes data to an external storage medium such as a memory card and reads data from the external storage medium. For example, the reader/writer 640 writes image data encoded by the image processing unit 620 to the external storage medium, and reads the image data stored in the external storage medium and outputs the read data to the image processing unit 620.

The calculation processing unit 650 is a component which functions as a controller for controlling each circuit block of the imaging device 600 and controls each control block on the basis of an operation input signal and the like from the operation input unit 660. On the basis of a control signal from the calculation processing unit 650, a driving driver of the module 500 controls a driving motor for driving a lens circle and the like.

The operation input unit 660 includes a switch, a touch panel, and the like to perform a predetermined operation by a user, for example, includes a shutter release operation element to perform a shutter operation, a selection operation element to select an operation mode, and the like. The operation input unit 660 outputs the operation input signal according to an operation input by the user to the calculation processing unit 650.

Furthermore, the present technology is not limited to the embodiments described above and includes a configuration in which the components disclosed in the embodiments are replaced with each other or a combination of the components is changed, a configuration in which the related art and the components disclosed in the embodiments are replaced with each other or a combination of the related art and the components is changed and the like. Furthermore, the technical scope of the present technology is not limited to the embodiments and includes the matters described in claims and equivalents.

Note that the present technology can have the following configuration.

(1) A semiconductor device including:

a semiconductor element manufactured by chip size packaging;

a transmissive material configured to be bonded with an adhesive to cover an optical element forming surface of the semiconductor element; and a side surface protective resin configured to cover an entire side surface where a layer structure of the semiconductor element and the transmissive material is exposed.

(2) The semiconductor device according to (1), in which the side surface protective resin includes a resin having lower moisture permeability and lower water permeability than an adhesive layer including the adhesive.

(3) The semiconductor device according to (1) or (2), in which the side surface protective resin is opaque.

(4) The semiconductor device according to any one of (1) to (3), in which the side surface protective resin has cutting traces made by a cutting tool across an entire surface opposed to a surface facing to the semiconductor element and the transmissive material.

(5) The semiconductor device according to any one of (1) to (4), in which a thickness of the side surface protective resin from the surface facing to the semiconductor element and the transmissive material to the opposite surface is substantially constant across the entire semiconductor element and the entire transmissive material in a lamination direction.

(6) The semiconductor device according to any one of (1) to (5), in which the side surface protective resin has an eaves-like portion provided and extended in an eaves shape along a surface of the transmissive material, and the eaves-like portion is formed to cover a non-light-receiving region or a non-light-emitting region of the optical element forming surface.

(7) A method of manufacturing a semiconductor device, including a workpiece forming process of bonding a semiconductor substrate on which a plurality of semiconductor elements is formed by chip size packaging to a transmissive material to cover an optical element forming surface of the semiconductor element with an adhesive to form a workpiece;

a first cutting process of singulating the workpiece fixed to a dicing sheet into a plurality of main structures of a semiconductor device;

a reconnecting process of filling a resin into first grooves which are gaps between the plurality of main structures fixed to the dicing sheet and curing the resin to reconnect the plurality of main structures; and a second cutting process of forming a second groove narrower than the first groove in the resin along a substantially center of the first groove to singulate as the plurality of semiconductor devices while remaining the resin on the side surfaces of the plurality of main structures.

(8) A method of manufacturing a semiconductor device, including a workpiece forming process of bonding a semiconductor substrate on which a plurality of semiconductor elements is formed by chip size packaging to a transmissive material to cover an optical element forming surface of the semiconductor element with an adhesive to form a workpiece;

a V-shaped groove forming process of forming a V-shaped groove along a boundary between the semiconductor elements from a side of the transmissive material;

a first cutting process of cutting the workpiece fixed to a dicing sheet into a plurality of main structures of the semiconductor element along a point of the V-shaped groove and singulating the workpiece;

a reconnecting process of filling a resin into first grooves and the V-shaped grooves which are gaps between the plurality of main structures fixed to the dicing sheet and curing the resin to reconnect the plurality of main structures; and a second cutting process of forming a second groove narrower than the first groove in the resin along a substantially center of the first groove to singulate as the plurality of semiconductor devices while remaining the resin on the side surfaces of the plurality of main structures.

(9) An electronic apparatus including:
a semiconductor device including:
a semiconductor element manufactured by chip size packaging;
a transmissive material bonded with an adhesive to cover an optical element forming surface of the semiconductor element; and
a side surface protective resin which covers an entire side surface where a layer structure of the semiconductor element and the transmissive material is exposed.

REFERENCE SIGNS LIST 10 semiconductor element
11 optical element forming surface
12 terminal forming surface
20 transmissive material
30 adhesive layer
40 solder bump
50 side surface protective resin
51 side surface
100 semiconductor device
200 semiconductor device
250 side surface protective resin
252 projection
300 semiconductor device
350 side surface protective resin
CF cutting plane
CD1 first cutting tool
CD2 second cutting tool
CD3 third cutting tool
DS dicing sheet
E1 corner
E2 corner
H1 mask opening
H2 mask opening
H3 mask opening
LP liquid resin
M main structure
M' main structure
MK mask
MK' mask
MK1 first partial mask
MK2 second partial mask
MK3 third partial mask
MK1 to MK3 partial mask
PS protective member
R1 light receiving region
R2 non-light-receiving region
R3 transmissive region
SF inclined surface
SP solid resin
SP' solid resin
T1 first groove
T2 second groove
T3 third groove
T4 fourth groove
T1' first groove
T2' second groove
W workpiece
W reconnection workpiece
W' reconnection workpiece

What is claimed is:
1. A semiconductor device comprising:
a semiconductor element;
a transmissive material configured to be bonded with an adhesive layer to cover an optical element forming surface of the semiconductor element, wherein the adhesive layer covers an entire surface of the optical element forming surface; and
a side surface protective resin configured to cover an entire side surface where a layer structure of the semiconductor element and the transmissive material are exposed, wherein the side surface protective resin has an eaves-like portion provided and extended in an eaves shape along a surface of the transmissive material at a 45 degrees angle, and wherein the eaves-like portion is formed to cover a non-light-receiving region or a non-light-emitting region of the optical element forming surface.

2. The semiconductor device according to claim 1, wherein
the side surface protective resin includes a resin having lower moisture permeability and lower water permeability than the adhesive layer.

3. The semiconductor device according to claim 1, wherein
the side surface protective resin is opaque.

4. The semiconductor device according to claim 1, wherein
the side surface protective resin has cutting traces made by a cutting tool across an entire surface opposite to a surface facing the semiconductor element and the transmissive material.

5. A method of manufacturing a semiconductor device, the method comprising:
a workpiece forming process of bonding a semiconductor substrate on which a plurality of semiconductor elements are formed by chip size packaging to a transmissive material to cover an optical element forming surface of the plurality of semiconductor elements with an adhesive layer to form a workpiece, wherein the adhesive layer covers an entire surface of the optical element forming surface;
a first cutting process of singulating the workpiece fixed to a dicing sheet into a plurality of main structures of the semiconductor device;
a reconnecting process of filling a resin into first grooves which are gaps between the plurality of main structures fixed to the dicing sheet and curing the resin to reconnect the plurality of main structures; and
a second cutting process of forming second grooves narrower than the first grooves in the resin along a substantially center of the first grooves to form a plurality of semiconductor devices while portions of the resin remain on side surfaces of the plurality of main structures, wherein the side surfaces of the resin have an eaves-like portion provided and extended in an eaves shape along a surface of the transmissive material at a 45 degrees angle, and wherein the eaves-like portion is formed to cover a non-light-receiving region or a non-light-emitting region of the optical element forming surface.

6. A method of manufacturing a semiconductor device, comprising:
a workpiece forming process of bonding a semiconductor substrate on which a plurality of semiconductor elements are formed by chip size packaging to a transmissive material to cover an optical element forming surface of the plurality of semiconductor elements with an adhesive layer to form a workpiece, wherein the adhesive layer covers an entire surface of the optical element forming surface;

a V-shaped groove forming process of forming V-shaped grooves along a boundary between the plurality of semiconductor elements from a side of the transmissive material;

a first cutting process of cutting the workpiece fixed to a dicing sheet into a plurality of main structures of the semiconductor element along a point of the V-shaped grooves and singulating the workpiece;

a reconnecting process of filling a resin into the V-shaped grooves which are gaps between the plurality of main structures fixed to the dicing sheet and curing the resin to reconnect the plurality of main structures; and a second cutting process of forming a second groove narrower than the V-shaped grooves in the resin along a substantially center of the V-shaped grooves to form a plurality of semiconductor devices while portions of the resin remain on side surfaces of the plurality of main structures, wherein the side surfaces of the resin have an eaves-like portion provided and extended in an eaves shape along a surface of the transmissive material at a 45 degrees angle, and wherein the eaves-like portion is formed to cover a non-light-receiving region or a non-light-emitting region of the optical element forming surface.

7. An electronic apparatus comprising:

a semiconductor device including:

a semiconductor element;

a transmissive material bonded with an adhesive layer to cover an optical element forming surface of the semiconductor element, wherein the adhesive layer covers an entire surface of the optical element forming surface; and a side surface protective resin which covers an entire side surface where a layer structure of the semiconductor element and the transmissive material are exposed, and wherein the side surface protective resin has an eaves-like portion provided and extended in an eaves shape along a surface of the transmissive material at a 45 degrees angle, and wherein the eaves-like portion is formed to cover a non-light-receiving region or a non-light-emitting region of the optical element forming surface.

\* \* \* \* \*